(12) United States Patent
Gabor et al.

(10) Patent No.: US 6,296,984 B1
(45) Date of Patent: Oct. 2, 2001

(54) ENERGY-SENSITIVE RESIST MATERIAL AND A PROCESS FOR DEVICE FABRICATION USING AN ENERGY-SENSITIVE RESIST MATERIAL

(75) Inventors: Allen H. Gabor, Summit; Francis Michael Houlihan, Millington; Omkaram Nalamasu, Bridgewater, all of NJ (US)

(73) Assignees: Agere Systems Guardian Corp., Orlando, FL (US); Arch Specialty Chemicals, Inc., Norwalk, CT (US)

( * ) Notice: Subject to any disclaimer, the term of this patent is extended or adjusted under 35 U.S.C. 154(b) by 0 days.

(21) Appl. No.: 09/268,448

(22) Filed: Mar. 12, 1999

(51) Int. Cl.⁷ .................................................. G03F 7/004
(52) U.S. Cl. ..................... 430/270.1; 430/325; 430/326; 430/914
(58) Field of Search ................................. 430/325, 270.1, 430/326, 914

(56) References Cited

U.S. PATENT DOCUMENTS

| | | | |
|---|---|---|---|
| 4,279,986 | * 7/1981 | Ohnishi et al. | 430/280 |
| 5,837,420 | * 12/1998 | Aoai et al. | 430/270.1 |
| 5,843,624 | 12/1998 | Houlihan et al. | 430/296 |
| 5,972,571 | * 10/1999 | Aviram | 430/325 |

FOREIGN PATENT DOCUMENTS

| | | | |
|---|---|---|---|
| 0828195A2 | 3/1998 | (EP) | G03F/7/027 |
| 2198736A | 6/1988 | (GB) | C08K/5/32 |
| 6222554 | 8/1994 | (JP) | G03F/7/004 |
| 08006253 | * 1/1996 | (JP) . | |

OTHER PUBLICATIONS

Photoresist: Materials and Methods, DeForest, W.S., McGraw–Hill, NY, 1975, pp. 2,3.*
CAPLUS abstract of JP 08006253, Jan. 1996.*
Houlihan et al., "Journal of Photopolymer Science and Technology", Photogenerators of Sulfamic Acids; Use Chemically Amplified Single Layer Resists, vol. 11, No. 3, pp. 419–429, 1998.
Moad et al., "Elsevier Science Ltd.", The Chemistry of Free Radical Polymerization, pp. 260–266, 1995.
English Translation of JP 8–006253, Jan. 1996.*
Houlihan, F.M. et al., Proceedings of the SPIE, The International Society for Optical Engineering , "193 nm Single-Layer Photoresists Based on Alternating Copolymers of Cycloolefins: The Use of Photogenerators of Sulfamic Acids", vol. 3333, No. 1, pp. 73–82, Feb. 1, 1998.
Nalamasu, O., *Microelectronic Engineering*, "Revolutionary and Evolutionary Resist Design Concepts for 193 nm Lithography", vol. 35, No. 1, pp. 133–136, Feb. 1, 1997.

* cited by examiner

*Primary Examiner*—Rosemary Ashton
(74) *Attorney, Agent, or Firm*—Richard J. Botos

(57) ABSTRACT

A process for device fabrication and resist materials that are used in the process are disclosed. The resist material contains acid labile groups either pendant to the polymer or to a dissolution inhibitor that is combined with the polymer. The acid labile groups significantly decrease the solubility of the polymer in a solution of aqueous base. The resist material also contains a photoacid generator and a radical scavenger. The radical scavenger reduces the amount of aromatic compounds outgassed from the resist during the lithographic process. A film of the resist material is formed on a substrate and exposed to delineating radiation. The radiation induces a chemical change in the resist material rendering the exposed resist material substantially more soluble in aqueous base solution than the unexposed portion of the resist material. The image introduced into the resist material is developed using conventional techniques, and the resulting pattern is then transferred into the underlying substrate.

28 Claims, No Drawings

ENERGY-SENSITIVE RESIST MATERIAL AND A PROCESS FOR DEVICE FABRICATION USING AN ENERGY-SENSITIVE RESIST MATERIAL

BACKGROUND OF THE INVENTION

1. Technical Field

The invention is directed to a process for device fabrication in which an energy sensitive resist material is used.

2. Art Background

Devices such as integrated circuits are complex structures made of a variety of materials. These materials are precisely configured to form the desired device by a variety of processes. A lithographic process is frequently used to transfer the desired configuration into a substrate to fabricate such devices.

Lithographic processes use intermediate materials frequently referred to as resists. A positive or negative image of the desired configuration is first introduced into the resist by exposing it to patterned radiation which induces a chemical change in the exposed portions of the resist. This chemical change is then exploited to develop a pattern in the resist, which is then transferred into the substrate underlying the resist.

The efficacy of a lithographic process depends at least in part on the resist used to transfer the pattern into the substrate. Certain types of resists offer particular advantages in the context of specific lithographic processes. For example, solution-developed resists are designed to have absorption characteristics appropriate for use at certain exposure wavelengths. It is axiomatic that, if the resist material is opaque to the exposing radiation, the exposing radiation will not be transmitted into the resist material and the desired chemical change will not occur. Therefore it is important to select a resist material that has the appropriate light transmission characteristics at the wavelength of the exposing radiation. Other considerations that drive the selection of an appropriate resist material include the etch resistance of the resist after it has been exposed and developed.

A variety of resist materials are employed in lithographic processes for device fabrication. One class of resist materials contains a polymer which has certain functional groups (e.g. alcohol (OH); phenol ($C_6H_5OH$); carboxylic acid (COOH); etc.). A certain portion of these functional groups are "masked," i.e., the hydrogen atom is removed and replaced by moieties referred to as protecting groups. These protecting groups are removable from the polymer by acidolysis and/or hydrolysis. A polymer with a significant number of these protecting groups has a very different solubility in developer solutions (typically aqueous base solutions) than a polymer with substantially fewer of these protecting groups. Examples of protecting groups include acetals, ketals, bis(trimethylsilylmethyl)methyloxy, t-butoxycarbonyloxy, t-butyl esters, and t-butyl ethers which are cleavable from the functional groups by acidolysis or hydrolysis. The functional groups from which the protecting groups have been cleaved are referred to as unmasked functional groups.

The resist materials also contain an energy-sensitive material in combination with the polymer. When exposed to a certain energy (energy of a particular wavelength (e.g. 248 nm) or type (electron beam)) a moiety is generated from the energy-sensitive material which effects the cleavage of the protecting group, thereby "unmasking" the functional group. When the protecting group is an acid labile group, i.e. it is removed in the presence of acid, the energy sensitive material is typically a photoacid generator (PAG). The greater the number of protecting groups that are cleaved from the polymer, the greater the chemical contrast between the polymer exposed to radiation and the polymer not exposed to radiation. This chemical contrast between the unexposed resist material and the exposed resist material is exploited to develop a pattern in the resist material.

One problem associated with the above-described materials is that some of the byproducts of the energy-induced reactions outgas from the resist material. Resist outgassing during exposure is a problem in deep UV lithography (248 nm, 193 nm, 157 nm etc.), extreme UV lithography, ion beam lithography and e-beam lithography (e.g. direct write and SCALPEL® (scattering with angular limitation projection electron beam lithography)). In UV lithography the outgassed constituents potentially condense on and damage the optics (e.g. the lenses) in the exposure tool. Outgassed aromatic compounds are especially deleterious in processes in which the exposure wavelength is 193 nm and less because the aromatic compounds absorb light at these exposure wavlengths. Consequently, outgassed aromatics that condense on the optics in the exposure tool reduce the efficiency of the tool by absorbing some of the radiation transmitted through the optics. Also, since the concentration of these absorbing species that condense on the optics tends to be non-uniform, the uniformity of the exposure is also adversely affected. In electron and ion beam lithography, the outgassed constituents potentially interfere with the high vacuum environment needed for exposure in addition to degrading the lithographic tool performance.

One proposed solution to the problem of resist outgassing is the use of a nitrogen purge to keep the outgassed constituents from condensing on the critical optical elements. However, this solution does not limit the amount of outgassing that occurs, and may not be feasible for all optical elements or lithographic tools. Furthermore, the adverse effects of outgassed materials that have a low vapor pressure are not ameliorated by a nitrogen purge. Accordingly, resist materials and lithographic processes that reduce or eliminate the problems associated with resist outgassing are sought.

SUMMARY OF THE INVENTION

The present invention is directed to an energy sensitive resist material that contains either a polymer with acid labile substituents pendant thereto or a polymer and a dissolution inhibitor with acid labile substituents pendant thereto. The energy sensitive resist material also contains a photoacid generator (PAG). The present invention is also directed to a process for device fabrication that utilizes such resist materials.

When the energy sensitive resist materials of the present invention are exposed to radiation, aryl radicals and/or aryl radical cations are produced. For convenience herein, the aryl radicals and/or aryl radical cations are referred to collectively herein as aryl radicals. These aryl radicals react with the other constituents of the energy sensitive resist material to produce aryl compounds that are outgassed from the energy sensitive resist material. The outgassed aryl compounds deposit on the optical elements of the lithographic tool. The aromatic constituent of these aryl compounds absorbs strongly at deep ultraviolet (UV) wavelengths (193 nm and less), and extreme ultraviolet (EUV; about 12–13 nm). Consequently, when aromatic compounds are deposited on optical elements, the ability of those optical elements to transmit light at these UV wavelengths is reduced. Accordingly, the resist material of the present invention contains what is referred to herein as a scavenger that reacts with the aryl radicals produced when the energy sensitive material undergoes photolysis. The scavenger at least partially prevents aryl compounds from being outgassed. The scavenger of the present invention reacts with the aryl radicals without significantly affecting the lithographic properties of the energy sensitive resist material.

The scavengers of the present invention include stable analogs of 5-member or 6-membered heterocyclic structures that contain a stable nitroxide radical and stable analogs of alkyl chains that contain a stable nitroxide radical. Examples of suitable structures include:

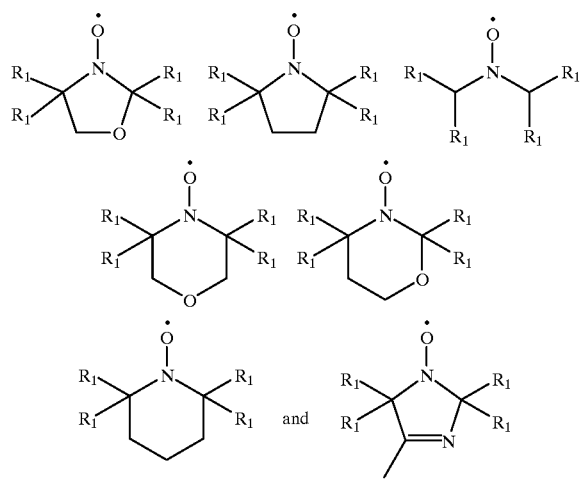

As illustrated by the above structures, full substitution of the carbon atoms adjacent to the nitroxide radical is required. Such substitution is required for the scavenger to be thermally stable and sufficiently non-volatile. Substitution at other positions in the ring or chain structures is contemplated to further reduce the volatility of the scavenger.

Suitable $R_1$ substituents include methyl groups ($CH_3$) and linear and branched chain alkyl groups having about 2 to about 18 carbon atoms. The $R_1$ substituents can be either the same or different. These linear and branched chain alkyl groups can be further substituted. Examples of such substitutents include carboxyl ($CO_2H$), alkylcarboxyl ($CO_2R$ wherein R is a linear or branched alkyl substituent with 1 to about 18 carbon atoms), hydroxyl (OH), alkoxy (OR wherein R is a linear or branched alkyl substituent with 1 to about 18 carbon atoms), cyano (CN), aminocarbonylalkyl (NHCOR), succimido ($C_4H_4NO_2$), sulfonic (SO3H), alkyl sulfonate (O—$SO_2$—R) and alkyl sulfone ($SO_2R$). Other examples of suitable substituents include cycloalkyl or polycycloalkyl substitutents having about 5 to about 18 carbon atoms. These cyclic substituents can be bound to the 1 position (i.e. the carbon atom adjacent to the nitroxide radical in the scavenger) via one bond or two.

As previously noted, the scavenger can be further substituted (i.e. the carbon atoms not adjacent to the nitroxide radical are also substituted) in order to further reduce its volatility. Examples of these substitutents include the substituted alkyls and cycloalkyls described above. Other substituents include alkylcarbonyl (RC=O), carboxyl ($CO_2H$), alkyl carboxylate ($CO_2R$), alkyl sulfonate (O—$SO_2R$), alkyl sulfone (O—$SO_2R$), alkyl ether (O—R) wherein the alkyl group is either linear or branched and has one to about eighteen carbon atoms. It is advantageous if these substituents are not highly absorbent of the exposing radiation. However, the use of more UV-absorbent aryl groups to further reduce volatility, such as benzene and naphthalene, is contemplated, provided that the quantity of these substituents does not adversely affect lithographic performance.

Other examples of suitable scavengers include stable radicals that are useful inhibitors in radical polymerization. Such radicals are known to one skilled in the art. Examples of such radicals include diphenylpicrylhydrazyl, triphenyl methyl, triphenyl verdazyl and galvinoxyl. Further examples of scavengers includes quinones such as chloranil, benzoquinone and alkyl substituted benzoquinone.

The weight of the radical scavenger in the energy sensitive resist material depends upon the weight of the PAG in the formulation. Specifically, the weight of the PAG is about one-tenth to about ten times the weight of the scavenger. It is advantageous if the weight of the PAG is about two-thirds to about three times the weight of the scavenger.

The scavenger of the present inventions is incorporated into a wide variety of energy sensitive resist materials. These include single layer resist materials, bilayer resist materials, and surface imaging resist materials (both positive and negative tone). These resist materials are used in processes in which the exposing radiation is deep UV (e.g. 248 nm, 193 nm, 157 nm), extreme UV, ion beam radiation, and electron beam radiation.

The particular scavenger used in a particular resist system is selected so that it will not adversely affect the lithographic performance of the resist system. For example, if the scavenger contains aromatic moieties, the scavenger should not be added in an amount that would increase the absorbence of the energy sensitive material above that which would be found acceptable for the particular process. For 193 nm-sensitive, single layer resist materials, the absorbence should not be more than about 0.7 absorbence units (A.U.) per micron.

In the process of the present invention, generally, the resist material containing the components described generally above is formed into a film on the surface of a substrate that is typically a silicon wafer. The silicon wafer will typically have layers of other materials formed thereon. These wafers, with or without layers of other materials formed thereon, are referred to herein as substrates.

The resist-coated substrate is then subjected to a patternwise exposure to radiation to delineate the image of a pattern into the energy-sensitive resist material. A chemical agent, the photoacid generated in the course of the irradiation, effects a chemical change (typically upon heating). In positive tone resists, this change enhances the aqueous base solubility of the irradiated portion of the resist.

After the image of the pattern is delineated in the resist material, the image is developed into a pattern by exploiting the difference in aqueous base solubility between the exposed resist material and the unexposed resist material. After the development, the pattern in the resist is transferred into the underlying substrate using conventional etching expedients well known to one skilled in the art.

DETAILED DESCRIPTION

The present invention is directed to a class of energy-sensitive resist materials that are useful in lithographic processes for device fabrication. Processes for device fabrication which include lithographic steps have been described in treatises such as S. M. Sze, *VLSI Technology*, (McGraw-Hill pub., 1983) and L. F. Thompson et al.,

*Introduction to Microlithography*, pp. 87–161 (American Chemical Society Symposium Series 219, 1983) which are hereby incorporated by reference. Lithographic steps typically include exposing and patterning energy definable materials such as resist materials. An image is first introduced into the resist and developed to form a pattern, which is then transferred into the substrate.

The materials are energy-sensitive; i.e., energy induces a chemical change in these materials. When these materials are exposed to patterned radiation of the appropriate wavelength, the chemical change is induced to a significantly greater extent in the portion of the resist material that is directly exposed to radiation than in the portion of the resist material that is not directly exposed to radiation. In the context of the present invention, significantly greater means that the chemical contrast induced by the patternwise exposure is adequate to meet processing objectives. This chemical difference is exploited to develop the pattern in the energy-sensitive resist material. The developed pattern is then used in subsequent processing, e.g., transfer of the developed pattern into an underlying substrate.

Aqueous base solutions are typically used to develop patterns in energy sensitive resist materials. One common example of an aqueous base solution is an aqueous solution of tetramethylammonium-hydroxide (TMAH) that is about 0.05 M to about 0.5 M, although many other solutions are well known to one skilled in the art.

The present invention contemplates the use of both negative tone and positive tone resist materials. In positive-tone resist materials, the material that is not exposed to radiation is relatively insoluble in the aqueous base developer solution relative to the material that is exposed to radiation. This difference in aqueous base solubility is effected by manipulating the aqueous base solubility of a constituent of the energy-sensitive resist material. That constituent is either the resist polymer with acid-labile substituents thereon, a dissolution inhibitor with acid-labile substituents thereon, or a combination thereof. Although the following discussion is directed to positive tone materials, one skilled in the art will appreciate that the present invention can be applied to either positive tone or negative tone energy sensitive materials.

The polymer or dissolution inhibitor has recurrent pendant groups that undergo efficient acidolysis which results in a significant change in the solubility of the polymer in the developer solution. It is advantageous if the polymer is a vinylic polymer. The polymers useful in the process of the present invention are not limited to polymers that are formed by vinylic radical polymerization, however. Other polymerizations such as condensation, polyaddition, and addition condensation are useful mechanisms for producing suitable polymers. In alternative embodiments, the recurrent pendant groups are not pendant to the polymer, but are pendant to a monomeric, polymeric, oligomeric dissolution inhibitor (or mixtures thereof) combined with a polymer that is inherently soluble in the developer solution used to develop patterns in the resist material.

Examples of suitable pendant groups include acid labile groups such as acetal groups, ketal groups, beta-silicon substituted alkyls such as bis(trimethylsilylmethyl)methyl and 1-(trimethylsilylmethyl)methyl, tert-butyl esters, tert-butyl esters of carboxylic acids, tert-butyl ethers and certain other tert-alkyl esters (e.g. t-amyl esters) that are susceptible to acidolytic cleavage. For convenience, "tert" is shortened to "t" hereinafter. However, it is understood that a wide range of acid labile groups are operative in the invention.

Examples of suitable polymers with these acid labile groups include acrylate-based polymers and copolymers, methacrylate-based polymers and copolymers, copolymers with alicylic moieties (e.g. norbornene) either incorporated into the polymer backbone or pendant to the polymer backbone. Examples of these polymers include tetra polymers such as poly(cycloolefin-alt-maleic anhydride-co-t-butyl acrylate-co-acrylic acid) wherein the cycloolefin is, for example, norbornene, 5,6-dihydrodicyclopentadiene, 1,5-cyclooctadiene, and 1,5-dimethyl-1,5-cyclooctadiene. Other suitable polymers include poly(norbornene t-butyl esters) which are described in Allen. R. D., et al. "Protecting Groups for 193-nm Photoresists" *Proc. SPIE*, Vol. 2724, p. 341 (1996), which is hereby incorporated by reference. Another example of a suitable polymer is the tetrapolymer of poly(isobornyl methacrylate-co-methyl methacrylate-co-t-butylmethacrylate-co-acrylic acid) described in Allen, R. D., et al. "Design Considerations for 193-nm Positive Resists" *ACS Symposium Series*, Vol. 614, chap. 17, p. 255 (1995) which is hereby incorporated by reference. These polymers are particularly useful when the exposing radiation is less than about 200 nm (e.g. 193 nm). Since these polymers do not contain aromatic moieties, the light absorption of the polymers at these wavelength is less than polymers with aromatic substituents (e.g. polymers and copolymers of hydroxystyrene wherein a portion of the hydroxyl substituents are replaced by acid labile groups). Resist polymers with aromatic substituents are contemplated as suitable in the present invention when the wavelength of the exposing radiation is greater than about 205 nm (e.g. 248 nm), ion beam, or electron beam.

The resist material also contains a PAG. The present invention is directed to reducing the amount of aryl radicals that react with other constituents of the resist material to form aryl compounds when the PAG undergoes photolysis (i.e. the acidic moiety is cleaved from the chromophore). This in turn reduces the amount of aryl compounds that are outgassed from the resist material. For purposes of explanation, the structure of the PAG is referred to generally as X-R, where X is the chromophore and R is the masked acidic moiety. In the present invention, a radical scavenger is added to the resist material and reacts with the aryl radicals that result from the photolysis of the PAG. The reaction product of the aryl radical and the radical scavenger is not outgassed from the resist material. Thus, the presence of the radical scavenger reduces the amount of aryl radicals that react to form aryl compounds that are outgassed from the resist material. In certain resist materials, the presence of the scavenger may also reduce or eliminate radical-induced resist matrix cross-linking.

Not all PAGs are a source of aryl radicals that react to form aryl compounds that are outgassed. Generally, PAGs with an aromatic moiety in the chromophore are potential sources of aromatic outgassing. The amount of aryl compound outgassing varies from chromophore to chromophore. For example, PAGs that have an iodonium chromophore (e.g. bis(t-butylphenyl) iodonium) outgas a greater amount of aryl compounds upon photolysis than PAGs that have a sulfonium chromophore (e.g. tris(-butylphenyl) sulfonium) or a nitrobenzyl chromophore (e.g., 2,6-dinitro-α-ethoxycarbonylbenzyl) chromophore. Although applicants do not wish to be held to a particular theory, applicants believe that the PAGs that are a greater source of aryl compound outgassing are PAGs that yield aryl radicals or aryl radical cations with small or few substituents.

In the present invention, the PAG has either a bis (substituted-aryl), iodonium choromphore or a tris (substituted-aryl) sulfonium chromophore. Examples of substituted aryls include phenyl, mono, di, or tris alkyl-substituted phenyls, biphenyl, alkyl biphenyl, naphthalene, alkyl naphthalene and phenylthiophenyl. The alkyl group in the above-described chromophores is either linear or branched and has one to about eighteen carbon atoms.

The scavengers of the present invention include stable analogs of 5-member or 6-membered heterocyclic structures that contain a stable nitroxide radical and stable analogs of alkyl chains that contain a stable nitroxide radical. Examples of suitable structures include:

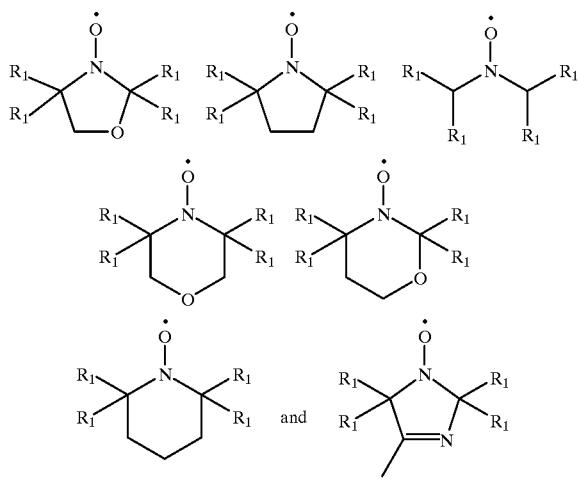

As illustrated by the above structures, full substitution of the carbon atoms adjacent to the nitroxide radical is required. Such substitution is required for the scavenger to be thermally stable and sufficiently non-volatile. Substitution at other positions in the ring or chain structures is contemplated to further reduce the volatility of the scavenger.

Suitable $R_1$ substituents include methyl groups ($CH_3$), linear and branched chain alkyl groups having about 2 to about 18 carbon atoms. $R_1$ can be either the same or different. These linear and branched chain alkyl groups can be further substituted. Examples of such substitutents carboxyl ($CO_2H$), alkylcarboxyl ($CO_2R$ wherein R is a linear or branched alkyl substituent with 1 to about 18 carbon atoms), hydroxyl (OH), alkoxy (OR wherein R is a linear or branched alkyl substituent with 1 to about 18 carbon atoms), cyano (CN), aminocarbonylalkyl (NHCOR), succimido ($C_4H_4NO_2$), sulfonic ($SO_3H$), alkl sulfonate ($O-SO_2-R$) and alkyl sulfone ($SO_2R$). Other examples of suitable substituents include cycloalkyl or polycycloalkyl substitutents having about 5 to about 18 carbon atoms. These cyclic substituents can be bound to the 1 position (i.e. the carbon atom adjacent to the nitroxide radical in the scavenger) via one bond or two.

As previously noted, the scavenger can be further substituted in order to further reduce its volatility. Examples of these substitutents include the substituted alkyls and cycloalkyls described above. Other substituents include alkylcarbonyl (RC=O), carboxyl ($CO_2H$), alkyl carboxylate ($CO_2R$), alkyl sulfonate (O—SO2R), alkyl sulfone ($O-SO_2R$) and alkyl ether (O—R) wherein alkyl is as defined above. It is advantageous if these substituents are not highly absorbent of the exposing radiation. However, the use of more UV-absorbent aryl ballast groups such as benzene and naphthalene is contemplated provided that the quantity of these substituents does not adversely affect lithographic performance.

Other examples of suitable scavengers include stable radicals that are useful inhibitors in radical polymerization. Such radicals are known to one skilled in the art. Examples of such radicals include diphenylpicrylhydrazyl, triphenyl methyl, triphenyl verdazyl and galvinoxyl. Further examples of scavengers includes quinones such as chloranil, benzoquinone and alkyl substituted benzoquinone.

The weight of the radical scavenger in the energy sensitive resist material depends upon the weight of the PAG in the formulation. Specifically, the weight of the PAG is about about one-tenth to about ten times the weight of the scavenger. It is advantageous if the weight of the PAG is about two-thirds to about three times the weight of the scavenger.

In the process, the energy-sensitive material is selectively exposed to radiation to form an image of a desired pattern in the energy-sensitive material. The radiation is either deep UV radiation, extreme UV radiation, ion beam radiation or electron beam radiation. That pattern is then developed and used in subsequent processing. The scavengers described herein are particularly effective at reducing the amount of aryl radicals that react to form aryl compounds that are outgassed from the resist during photolysis. Outgassed aryl compounds pose particular problems when the exposing radiation is UV radiation with a wavelength of 193 nm or less due to the high absorbence of aromatic compounds at these wavelengths. The energy sensitive resist material is therefore particularly advantageous if used in lithographic processes in which the exposing radiation has a wavelength of about 193 nm or less.

The resist materials of the present invention include both positive tone and negative tone single layer resist materials, surface imaging resist materials, and bilayer resist materials. Polymers contemplated for use in single layer resist materials include acrylate-based resins that are soluble in aqueous base solution. Examples of such acrylate-based resins are described in the previously-mentioned article Allen, R. D., et al., "ACS Symposium Series. Vol. 614, chap. 17, p. 255 (1995). Other examples of suitable polymers include the polymers with saturated alicyclic moieties described in U.S. Ser. No. 08/803,703 filed Mar. 6, 1996, now U.S. Pat. No. 5,843,624, which is incorporated by reference herein.

The amount of PAG in the resist materials of the present invention will depend upon the type of resist material (i.e. single layer, bilayer, etc.) and the wavelength of the exposing radiation. Typically, the amount of PAG is about 1 weight percent to abut 20 weight percent of the resist formulation (not including solvent). The PAGs used in resist formulations of the present invention have aromatic moieties in the chromophore. In processes wherein the exposure wavelength is absorbed by aromatic moieties, the amount of PAG in the resist materials is about 0.5 weight percent to about 4 weight percent.

The photoacid cleaves the acid labile groups from either the polymer or the dissolution inhibitor, typically during a post-exposure bake. The cleavage of these groups from the polymer causes the exposed resist material to be more soluble than the unexposed resist material in aqueous base solution. An aqueous base developer solution is then used to dissolve and remove the exposed resist material. The unexposed resist material is then used as a patterned mask for subsequent processing of the underlying substrate; typically for pattern transfer into the substrate.

In the above-described embodiments, the solubility of the resist composition in aqueous base solution is altered when the resist material is exposed to radiation. Since the resist materials of the present invention are positive resists, the aqueous base solubility of the exposed resist is greater than the aqueous base solubility of the resist that is not exposed to radiation. If the ratio of the rate of dissolution of the resist before irradiation compared to that after irradiation is taken as 1:n, n should be not be less than 2. Relative solubility ratios with values of n less than 2 typically produce low contrast and inferior image quality.

An appropriate optical density in the wavelength range of the exposing radiation significantly enhances resist quality. Too low an optical density results in inefficient absorption of the exposing radiation and in unnecessarily long exposure times. Too high an optical density does not permit sufficient light to reach the regions of the polymer film furthest removed from its ambient/resist film interface. This incomplete exposure tends to degrade resist image quality.

The optical density depends on the concentration of the absorbing species in the resist material constituents (e.g. polymer, PAG, etc.). Thus, once a suitable thickness for the resist material coating is chosen, the resist composition is adjusted to provide the desired optical density. For continuous films of such thicknesses, useful results are attained if the desired optical density is maintained.

In the process of the present invention, generally, the resist material described generally above is formed into a film on the surface of a substrate that is typically a silicon wafer. The silicon wafer will typically have layers of other materials formed thereon. These wafers, with or without layers of other materials formed thereon, are referred to herein as substrates.

The thickness of the film depends upon a variety of factors such as the absorption of the resist, the quality of the film, and the effect of thickness on image resolution. Typically, the thickness of a single layer resist film is in the range of about 0.2 $\mu$m to about 2 $\mu$m.

After coating, the resist is preferably prebaked to remove any remaining solvent. Pre-exposure baking temperatures in the range of 70° C. to 170° C. for times in the range of about 0.5 to about 60 minutes are desirable. The resist material is then exposed to energy such as ultraviolet radiation with a wavelength of about 190 nm to about 370 nm. Typical doses in the range of 5 to 250 mJoules/cm$^2$ for 193 nm light are contemplated as suitable. Conventional exposure techniques are employed to delineate the resist material. One skilled in the art will appreciate that the selection of a suitable exposure dose will depend upon the particular resist material that is used, as well as other process variables.

It is then desirable to post exposure bake the exposed material. This post-bake enhances the reaction of, depending upon the particular embodiment, the relatively insoluble dissolution inhibitor and, if applicable, polymer, with the photoacid. Generally, post-bake temperatures in the range of about 70° C. to about 170° C. for time periods of about 20 seconds to about 30 minutes are effective. Heating means such as a hot plate sold by Brewer Sciences are contemplated as useful.

Solvents suitable for developing the exposed image are materials such as water/tetramethylammonium hydroxide, water/NaOH, water/KOH or water and base with lower alkyl alcohols such as isopropanol, ethanol, methanol, and mixtures thereof. Generally, immersion in the developer for time periods from 10 seconds to 5 minutes produces the desired delineation.

After the development, the pattern in the resist is transferred into the underlying substrate using conventional etching expedients well known to one skilled in the art.

The following examples are provided to further illustrate exemplary embodiments of the present invention. The examples are not intended by way of limitation, except within the spirit and scope of the appended claims.

EXAMPLE 1

A copolymer of norbornene, maleic anhydride, t-butyl acrylate and acrylic acid was synthesized according to the following procedure. Norbornene (39.81 g; 423 mmol) was vacuum-transferred into a dry 500 mL Schlenk flask equipped with two PTFE-stoppered inlet valves and an efficient stir-bar. Freshly sublimed maleic anhydride (41.5 g; 423 mmol), distilled t-butyl acrylate (24.4 g; 190 mmol), and distilled acrylic acid (6.86 g; 95 mmol), AIBN (0.695 g; 1 mole percent), and THF (90 mL) were added under positive argon pressure. The mixture was degassed by three freeze-pump-thaw cycles, sealed, and immersed in an oil bath at 65° C. for 20 hours. Upon cooling, the mixture was precipitated into 5 volumes of diethyl ether and filtered to collect the polymer. Upon cooling, the mixture was precipitated into 5 volumes of diethyl ether and filtered to collect the polymer. This process was repeated three more times. The polymer was collected in the final filtration and dried at 50° C. under vacuum. The resulting polymer was poly ((norbornene-alt-maleic anhydride)-t-butylacrylate-acrylic acid)) wherein the polymer is 22.5 mole percent acrylic acid, 45 mole percent t-butylacrylic acid and 42.5 mole percent an alternating copolymer of norbornene and maleic anhydride.

An oligomer of t-butylcholate and glutarate was synthesized by charging an oven-dried, argon-purged Schlenk tube with t-butylcholate (2 g; 4.457 mmol)(previously dried under vacuum at 60° C. overnight), N-methylmorpholine (3.26 g; 32.2 mmol)(distilled from CaH$_2$), and THF (35 mL). The mixture was cooled to 0° C. and distilled glutaryl dichloride (1.232 mL; 9.654 mmol; 1.632 g) was slowly added using a gas tight syringe. The tube was sealed and heated to 60° C. overnight. The reaction solution was then diluted with methanol (20 percent) and precipitated into water (500 mL) containing acetic acid to neutralize the N-methylmorpholine. The dilution/precipitation was repeated twice. The polymer was recollected by filtration, washed with distilled water and dried in vacuum at 60° C. The yield was 4 g (74 percent yield). The structure of the resulting oligomer was

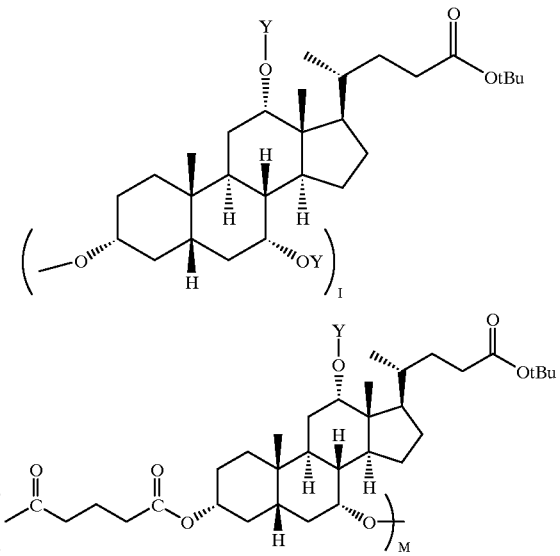

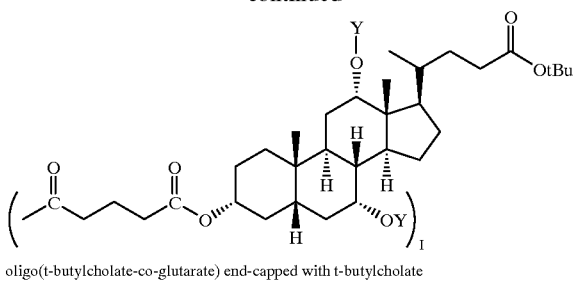

oligo(t-butylcholate-co-glutarate) end-capped with t-butylcholate wherein tBu indicates a tert-butyl substituent and Y indicates either a hydrogen or another unit in the structure defined by the parenthesis and having the subscript M or 1. The number of units M per molecule was about 5 to about 20. As previously noted, the condensation reaction can occur at any OH substituent on the polycyclic compound. Therefore, the condensation reaction product of a cholate (having three hydroxyl substituents) is likely to have a branched structure. The above structure is provided to assist in describing the reaction product, but is not to be construed to depict the actual structure of the product that was obtained.

Resist formulation 1 was prepared by dissolving poly ((norbornene-alt-maleic anhydride)-t-butylacrylate(45)-acrylic acid(22.5)) (1.173 g), oligo(t-butylcholate-co-glutarate) (0.4795 g), 0.4795 g tert-butyldeoxycholate, bis(4-tert-butylphenyl)iodonium nonaflate (0.0548 g) and triphenylimidazole (0.004567 g) in propylene glycol methyl ether acetate (17.26 g). After complete dissolution, the solution was filtered through 0.2 μm Teflon filters (Millipore, Inc.).

Resist formulation 2 was the same as resist formulation 1 except that a radical scavenger, methyl 5-doxyl stearate (0.0457 g) having the following structure:

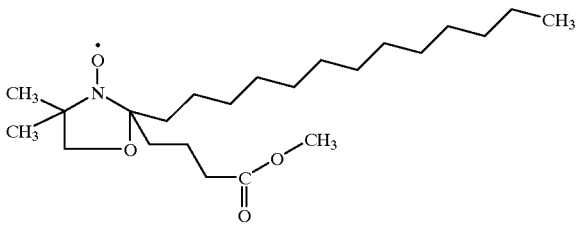

was added to the formulation.

Silicon wafers were coated with the above-described formulations. The formulation were applied to a separate wafer using a Machine Technology Incorporated (MTI) model Flexilab track. The spin speed was 3000–3900 rpm to get a nominal resist thickness of about 0.4 μm to about 0.36 μm. The coated wafers were baked at 140° C. for 90 seconds. The resist thickness was measured by a Nanospec AFT thickness gauge using a refractive index of 1.50 (the refractive index of the formulated resist).

The coated wafers were then exposed to patterned radiation. The radiation had a wavelength of 193 nm and a dose of 5 to 50 mJ/cm$^2$. The radiation was projected through a mask onto the coated wafers. The exposure tool used was a GCA XLS KrF excimer laser stepper with a 0.53 NA lens obtained from GCA of Tewksbury, Mass.

After the coated wafers were exposed to radiation, the wafers were baked at 150° C. for 60 seconds. The patterns were developed using a 10 second puddle with OPD-4262 (0.262 N tetramethyl ammonium hydroxide) (OPD is Olin Microelectronics Materials, Inc., of East Providence, R.I.) on an MTI track. The linewidths were measured on a Hitachi S-600 CD-SEM and cross section profiles were obtained by a JEOL 6400 F SEM. Table 1 compares the exposure dose and outgassing rates for formulations 1 and 2.

TABLE 1

| | Resist Formulation | |
|---|---|---|
| | 1 | 2 |
| Dose (mJ/cm$^2$) | 23 | 36 |
| Total Outgassing Rate (molecule/cm$^2$-sec) | $6.3 \times 10^{11}$ | $4.6 \times 10^{11}$ |
| Isobutene (GMCS counts) | $3.2 \times 10^5$ | $1.7 \times 10^5$ |
| Unidentified fluorocarbon (GMCS counts) | 0 | $7.3 \times 10^3$ |
| Unidentified fluorocarbon (GMCS counts) | 0 | $1.7 \times 10^4$ |
| Perfluorobutane (GMCS counts) | $3.4 \times 10^5$ | $3.5 \times 10^5$ |
| t-butyl benzene (GMCS counts) | $4.5 \times 10^5$ | $1.18 \times 10^5$ |
| Iodo-t-butyl benzene (GMCS counts) | $5.3 \times 10^4$ | 0 |
| SUM of outgassed products | $1.16 \times 10^6$ | $1.7 \times 10^5$ |

The presence of the radical scavenger in the resist formulation reduced the outgassing rate and the sum of the outgassed products. The presence of the radical scavenger also reduced the amount of t-butyl benzene that was outgassed from the resist formulation. Also, no measurable amount of iodo-t-butyl benzene was outgassed from the resist material that contained the radical scavenger.

The present invention has been described in terms of differed examples, which have been provided to illustrate the invention. The examples have specified both resist materials and exposure wavelengths which have been provided for illustrative purposes only. These examples are not to be construed to limit the invention other than in a manner that is consistent with the appended claim.

What is claimed is:

1. A process for device fabrication comprising:
   forming a layer of an energy sensitive resist material on a substrate wherein the energy sensitive resist material comprises a polymer, a photoacid generator and a scavenger that reacts with aryl radicals wherein the photoacid generator has a general structure X-R wherein X is a chromophore selected from the group consisting of bis(substituted aryl)iodonium and tris(substituted aryl)sulfonium and R is a masked acidic moiety;
   exposing the layer of energy sensitive resist material to patterned radiation selected from the group consisting of ultraviolet radiation, x-ray radiation, ion beam radiation and electron beam radiation thereby introducing an image of the pattern into the resist material;
   developing the image into a pattern; and
   transferring the pattern into the underlying substrate.

2. A process for device fabrication comprising:
   forming a layer of an energy sensitive resist material on a substrate wherein the energy sensitive resist material comprises a polymer, a photoacid generator and a scavenger that reacts with aryl radicals wherein the photoacid generator has a general structure X-R wherein X is a chromophore selected from the group consisting of bis(substituted aryl)iodonium and tris(substituted aryl)sulfonium and R is a masked acidic moiety and wherein the scavenger that reacts with aryl radicals is selected from the group consisting of stable analogs of 5-member or 6-member heterocylic structures that contain a stable nitroxide radical selected from the group consisting of:

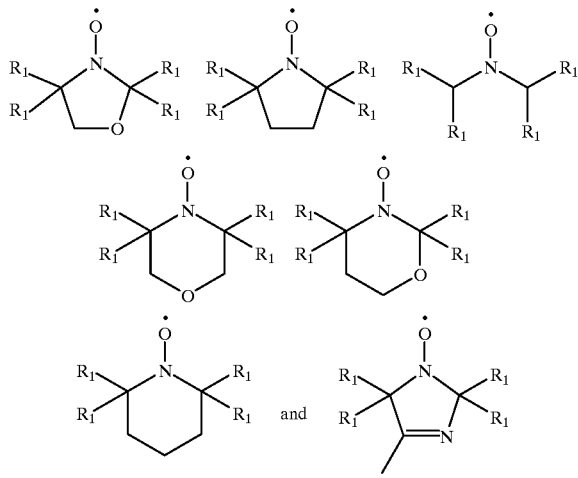

wherein $R_1$ is the same or different and is selected from the group consisting of methyl groups, linear and branched chain alkyl groups having about 2 to about 18 carbon atoms wherein the linear and branched chain alkyl groups are further substituted and those substituents are selected from the group consisting of carboxyl, alkylcarboxyl, hydroxyl, alkoxy, cyano, aminocarbonylalkyl, succimido, sulfonic, alkyl sulfonate and alkyl sulfone, wherein the alkyl group in the substituent is a linear or branched alkyl substituent with 1 to about 18 carbon atoms, cycloalkyl substituents having about 5 to about 18 carbon atoms and polycycloalkyl substituents having about 5 to about 18 carbon atoms, stable analogs of alkyl chains that contain a stable nitroxide radical, stable radicals that inhibit radical polymerization, and quinones;

exposing the layer of energy sensitive resist material to patterned radiation selected from the group consisting of ultraviolet radiation, x-ray radiation, ion beam radiation and electron beam radiation thereby introducing an image of the pattern into the resist material;

developing the image into a pattern; and transferring the pattern into the underlying substrate.

3. The process of claim 2 wherein the linear and branched chain alkyl groups are further substituted and those substituents are selected from the group consisting of carboxyl, alkylcarboxyl, hydroxyl, alkoxy, cyano, aminocarbonylalkyl, succimido, sulfonic, alkyl sulfonate and alkyl sulfone, wherein the alkyl group in the substituent is a linear or branched alkyl substituent with 1 to about 18 carbon atoms.

4. The process of claim 2 wherein the weight of the photoacid generator in the energy sensitive material is about one-tenth to about ten times the weight of the scavenger in the energy sensitive resist material.

5. The process of claim 2 wherein the weight of the photoacid generator in the energy sensitive material is about two-thirds to about three times the weight of the scavenger in the energy sensitive resist material.

6. The process of claim 2 wherein the polymer to which the acid labile substituents are pendant is selected from the group consisting of acrylate-based polymers and copolymers, methacrylate-based polymers and copolymers, polymers and copolymers with alicyclic moieties incorporated into the polymer backbone, polymers and copolymers with alicyclic substituents pendant to the polymer backbone, and hydroxystyrene-based polymers and copolymers.

7. The process of claim 2 wherein the energy sensitive resist material further comprises a dissolution inhibitor.

8. The process of claim 7 wherein the dissolution inhibitor has recurrent acid labile substituents pendant thereto wherein the acid labile groups are selected from the group consisting of acetal groups, ketal groups, tert-butyl esters, tert-amyl esters, tert-butyl esters of carboxylic acids, tert-butyl ethers and bis(trimethylsilylmethyl)methyl groups.

9. The process of claim 8 wherein the acetal and ketal groups have the following structure

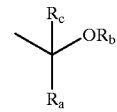

wherein $R_a$, $R_b$ and $R_c$ are selected from the group consisting of hydrogen, alkyl moieties with no more than about eight carbon atoms, cycloalkyl moieties with no more than about eight carbon atoms and wherein the acetal or ketal moiety is linked to the dissolution inhibitor by an oxygen atom.

10. The process of claim 9 wherein the polymer has recurrent acid labile substituents pendant thereto wherein the acid labile groups are selected from the group consisting of tert-butyl esters, tert-amyl esters, tert-butyl esters of carboxylic acid, tert-butyl ethers, acetal groups, ketal groups, and bis(trimethyl silylmethyl) methyl groups.

11. The process of claim 10 wherein the polymer to which the acid labile substituents are pendant is selected from the group consisting of acrylate-based polymers and copolymers, methacrylate-based polymers and copolymers, polymers and copolymers with alicyclic moieties incorporated into the polymer backbone, polymers and copolymers with alicyclic substituents pendant to the polymer backbone, and hydroxystyrene-based polymers and copolymers.

12. A process for device fabrication comprising:

forming a layer of an energy sensitive resist material on a substrate wherein the energy sensitive resist material comprises a polymer, a photoacid generator and a scavenger that reacts with aryl radicals wherein the photoacid generator has a general structure X-R wherein X is a chromophore selected from the group consisting of bis(substituted aryl)iodonium and tris (substituted aryl)sulfonium and R is a masked acidic moiety and wherein the scavenger that reacts with aryl radicals is a stable radical that inhibits radical polymerization and is selected from the group consisting of diphenylpicrylhydrazyl, triphenyl methyl, triphenyl verdazyl and galvinoxyl;

exposing the layer of energy sensitive resist material to patterned radiation selected from the group consisting of ultraviolet radiation, x-ray radiation, ion beam radiation and electron beam radiation thereby introducing an image of the pattern into the resist material;

developing the image into a pattern; and transferring the pattern into the underlying substrate.

13. A process for device fabrication comprising:

forming a layer of an energy sensitive resist material on a substrate wherein the energy sensitive resist material comprises a polymer, a photoacid generator and a scavenger that reacts with aryl radicals wherein the photoacid generator has a general structure X-R wherein X is a chromophore selected from the group consisting of bis(substituted aryl)iodonium and tris (substituted aryl)sulfonium and R is a masked acidic moiety and wherein the scavenger that reacts with aryl radicals is a quinone selected from the group consisting of chloranil, benzoquinone and alkyl substituted benzoquinone;

exposing the layer of energy sensitive resist material to patterned radiation selected from the group consisting of ultraviolet radiation, x-ray radiation, ion beam radiation and electron beam radiation thereby introducing an image of the pattern into the resist material;

developing the image into a pattern; and transferring the pattern into the underlying substrate.

14. A resist material comprising:

a polymer, a photoacid generator and a scavenger that reacts with aryl radicals that is selected from the group consisting of stable analogs of 5-member or 6-member heterocylic structures that contain a stable nitroxide radical having the structure:

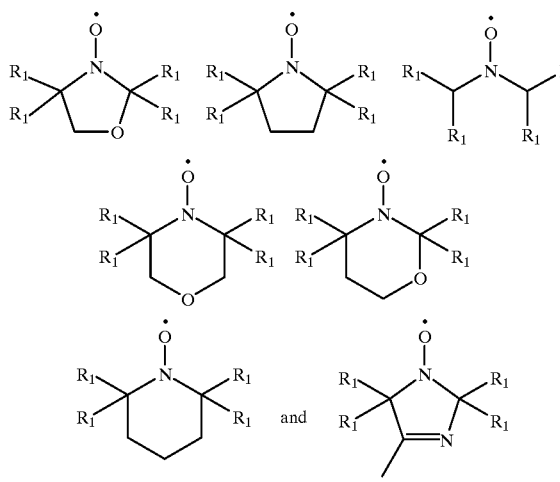

wherein $R_1$ is the same or different and is selected from the group consisting of methyl groups, linear and branched chain alkyl groups having about 2 to about 18 carbon atoms, cycloalkyl substituents having about 5 to about 18 carbon atoms and polycycloalkyl substituents having about 5 to about 18 carbon atoms, stable analogs of alkyl chains that contain a stable nitroxide radical, stable radicals that inhibit radical polymerization, and quinones and wherein the photoacid generator has a general structure X-R wherein X is a chromophore selected from the group consisting of bis (substituted aryl)iodonium and tris(substituted aryl) sulfonium and R is a masked acidic moiety.

15. The resist material of claim 14 wherein the stable radicals that inhibit radical polymerization are selected from the group consisting of diphenylpicrylhydrazyl, triphenyl methyl, triphenyl verdazyl and galvinoxyl.

16. The resist material of claim 14 wherein the quinones are selected from the group consisting of chloranil, benzoquinone and alkyl substituted benzoquinone.

17. The resist material of claim 14 wherein the weight of the photoacid generator in the resist material is about one-tenth to about ten times the weight of the scavenger in the energy sensitive resist material.

18. The resist material of claim 14 wherein the weight of the photoacid generator in the resist material is about two-thirds to about three times the weight of the scavenger in the energy sensitive resist material.

19. A resist material comprising:

a polymer, a photoacid generator and a scavenger that reacts with aryl radicals wherein the photoacid generator has a general structure X-R wherein X is a chromophore selected from the group consisting of bis (substituted aryl)iodonium and tris(substituted aryl) sulfonium and R is a masked acidic moiety.

20. The resist material of claim 19 wherein the scavenger that reacts with aromatic radicals is selected from the group consisting of stable analogs of 5-member or 6-member heterocyclic structures that contain a stable nitroxide radical, stable analogs of alkyl chains that contain a stable nitroxide radical, stable radicals that inhibit radical polymerization, and quinones.

21. The resist material of claim 20 wherein the stable analogs of stable nitroxide radicals are selected from the group consisting of:

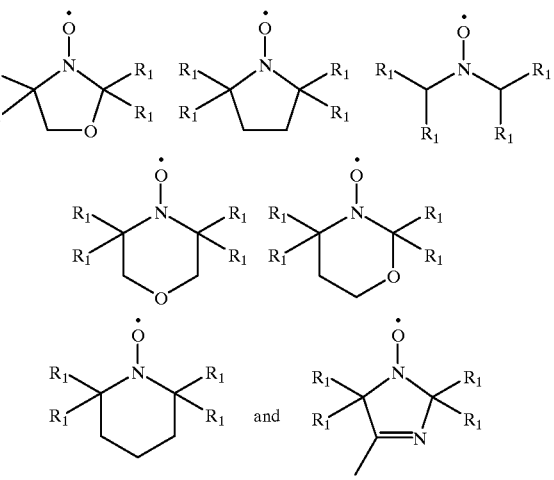

wherein $R_1$ is the same or different and is selected from the group consisting of methyl groups, linear and branched chain alkyl groups having about 2 to about 18 carbon atoms, cycloalkyl substituents having about 5 to about 18 carbon atoms and polycycloalkyl substituents having about 5 to about 18 carbon atoms.

22. The resist material of claim 21 wherein the linear and branched chain alkyl groups are further substituted and those substituents are selected from the group consisting of carboxyl, alkylcarboxyl, hydroxyl, alkoxy, cyano, aminocarbonylalkyl, succimido, sulfonic, alkyl sulfonate and alkyl sulfone, wherein the alkyl group in the substituent is a linear or branched alkyl substituent with 1 to about 18 carbon atoms.

23. A resist material comprising:

a polymer wherein the polymer has acid labile substituents pendant thereto and is selected from the group consisting of acrylate-based polymers and copolymers, methacrylate-based polymers and copolymers, polymers and copolymers with alicyclic moieties incorporated into the polymer backbone, polymers and copolymers with alicyclic substituents pendant to the polymer backbone, and hydroxystyrene-based polymers and copolymers, a photoacid generator and a scavenger that reacts with aryl radicals wherein the photoacid generator has a general structure X-R wherein X is a chromophore selected from the group consisting of bis (substituted aryl)iodonium and tris(substituted aryl) sulfonium and R is a masked acidic moiety.

24. A resist material comprising:
a polymer, a photoacid generator, a dissolution inhibitor and a scavenger that reacts with aryl radicals wherein the photoacid generator has a general structure X-R wherein X is a chromophore selected from the group consisting of bis(substituted aryl)iodonium and tris (substituted aryl)sulfonium and R is a masked acidic moiety.

25. The resist material of claim 24 wherein the dissolution inhibitor has recurrent acid labile substituents pendant thereto wherein the acid labile groups are selected from the group consisting of acetal groups, ketal groups, tert-butyl esters, tert-amyl esters, tert-butyl esters of carboxylic acids, tert-butyl ethers and bis(trimethylsilylmethyl)methyl groups.

26. The resist material of claim 25 wherein the acetal and ketal groups have the following structure

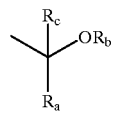

wherein $R_a$, $R_b$ and $R_c$ are selected from the group consisting of hydrogen, alkyl moieties with no more than about eight carbon atoms, cycloalkyl moieties with no more than about eight carbon atoms and wherein the acetal or ketal moiety is linked to the dissolution inhibitor by an oxygen atom.

27. The resist material of claim 26 wherein the polymer has recurrent acid labile substituents pendant thereto wherein the acid labile groups are selected from the group consisting of tert-butyl esters, tert-amyl esters, tert-butyl esters of carboxylic acid, and tert-butyl ethers, acetal groups, ketal groups, and bis(trimethyl silylmethyl)methyl groups.

28. The resist material of claim 27 wherein the polymer to which the acid labile substituents are pendant is selected from the group consisting of acrylate-based polymers and copolymers, methacrylate-based polymers and copolymers, polymers and copolymers with alicyclic moieties incorporated into the polymer backbone, polymers and copolymers with alicyclic substituents pendant to the polymer backbone, and hydroxystyrene-based polymers and copolymers.

* * * * *